US010365563B2

(12) United States Patent
Nagai et al.

(10) Patent No.: US 10,365,563 B2
(45) Date of Patent: Jul. 30, 2019

(54) FILM FORMATION METHOD, DRY FILM MANUFACTURING METHOD AND LIQUID EJECTION HEAD MANUFACTURING METHOD

(71) Applicant: CANON KABUSHIKI KAISHA, Tokyo (JP)

(72) Inventors: Masataka Nagai, Yokohama (JP); Seiichiro Yaginuma, Kawasaki (JP); Shingo Nagata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/051,714

(22) Filed: Aug. 1, 2018

(65) Prior Publication Data
US 2019/0049846 A1 Feb. 14, 2019

(30) Foreign Application Priority Data

Aug. 8, 2017 (JP) .................. 2017-153131

(51) Int. Cl.
*H01L 21/67* (2006.01)
*G03F 7/16* (2006.01)
*B05D 1/00* (2006.01)
*G03F 7/00* (2006.01)
*G03F 7/11* (2006.01)
*H01L 21/00* (2006.01)

(52) U.S. Cl.
CPC ............. *G03F 7/162* (2013.01); *B05D 1/005* (2013.01); *G03F 7/0035* (2013.01); *G03F 7/11* (2013.01); *G03F 7/161* (2013.01); *H01L 21/00* (2013.01); *H01L 21/6715* (2013.01)

(58) Field of Classification Search
None
See application file for complete search history.

(56) References Cited

U.S. PATENT DOCUMENTS

| 7,287,847 | B2 | 10/2007 | Fujii et al. | |
| 7,753,502 | B2 | 7/2010 | Fujii et al. | |
| 7,862,158 | B2 | 1/2011 | Fujii et al. | |
| 2003/0152845 | A1* | 8/2003 | Kumada | G03F 7/11 430/5 |
| 2006/0205223 | A1* | 9/2006 | Smayling | G03F 7/40 438/725 |
| 2008/0160454 | A1* | 7/2008 | Shimomura | B41J 2/1603 430/320 |
| 2008/0171285 | A1* | 7/2008 | Patterson | G03F 7/11 430/270.1 |

(Continued)

FOREIGN PATENT DOCUMENTS

| JP | 10-303101 A | 11/1998 |
| JP | 11-340113 A | 12/1999 |

*Primary Examiner* — Asok K Sarkar
(74) *Attorney, Agent, or Firm* — Venable LLP

(57) ABSTRACT

Provided is a film formation method including the steps of: forming a resist film on an object to be applied, forming a layer of a protecting material removable by a first dissolving liquid on the upper surface of the resist film, removing the resist film from a region not having, on the upper surface thereof, the layer of the protecting material by side rinsing with a second dissolving liquid capable of dissolving the resist film therein, and removing the protecting material remaining on the upper surface of the resist film by the first dissolving liquid.

20 Claims, 5 Drawing Sheets

(56) References Cited

U.S. PATENT DOCUMENTS

2014/0212997 A1     7/2014   Yaginuma et al.
2016/0111253 A1*   4/2016   Ohnishi .............. H01J 37/3174
                                                                    250/492.3

* cited by examiner

FILM FORMATION METHOD, DRY FILM MANUFACTURING METHOD AND LIQUID EJECTION HEAD MANUFACTURING METHOD

BACKGROUND OF THE INVENTION

Field of the Invention

The present invention relates to a film formation method, a dry film manufacturing method and a liquid ejection head manufacturing method.

Description of the Related Art

As one of the cores of semiconductor manufacturing technology, there is a step of applying a resist material onto a substrate or a base film.

Spin coating is known as a common technique for applying a resist material. Spin coating is a method of rotating a smooth base material at high speed and forming a thin film by making use of the resulting centrifugal force. High accuracy is required because the accuracy of the thickness of a film formed by application directly affects the dimensional accuracy of a product. In general, a portion of a wafer or base film outside an effective region is subjected to a resist material removing step called "side rinsing" (or edge rinsing). The term "portion within an effective region" as used herein means a portion of a substrate or a dry film which will be used actually in a product or the like after the removing step and the term "portion outside an effective region" means a portion which will not be used actually in a product.

Side rinsing is performed using an apparatus having a mechanism called "side rinse nozzle". A portion of a resist material outside an effective region is removed by jetting a solvent to the outside of the effective region from the side rinse nozzle. When side rinsing is performed, it is necessary to continue rotation of a substrate or film at the number of revolutions above a certain level in order to keep flatness of the resist. In addition, side rinsing should be performed under high pressure in order to sufficiently apply a solvent to the resist in spite of centrifugal force created by the rotation.

During side rinsing, there may occur rinse splashes due to scattering of a side rinse liquid being applied to the resist. Then, the rinse splashes scatter and may dissolve the resist film within the effective region which does not essentially demand solvent application. Japanese Patent Application Laid-Open No. H10-303101 describes a technique of placing, at a position near a rinse liquid nozzle, an anti-adhesion plate for preventing adhesion of rinse liquid splashes from adhering onto a treatment substrate. Japanese Patent Application Laid-Open No. H11-340113 describes a technique of providing a guard ring detachably from a side rinse nozzle to the center side of a wafer and fixing the guard ring at a position facing the substrate while keeping a predetermined clearance therebetween.

SUMMARY OF THE INVENTION

The invention is characterized by including a step of forming a resist film on an object to be applied, a step of forming a layer of a protecting material removable by a first dissolving liquid on the upper surface of the resist film, a step of removing the resist film from a region not having, on the upper surface thereof, the protecting material layer by side rinsing with a second dissolving liquid capable of dissolving the resist film and a step of removing the protecting material which has remained on the upper surface of the resist film by the first dissolving liquid.

Further features of the present invention will become apparent from the following description of exemplary embodiments with reference to the attached drawings.

DESCRIPTION OF THE EMBODIMENTS

Figure 1A:
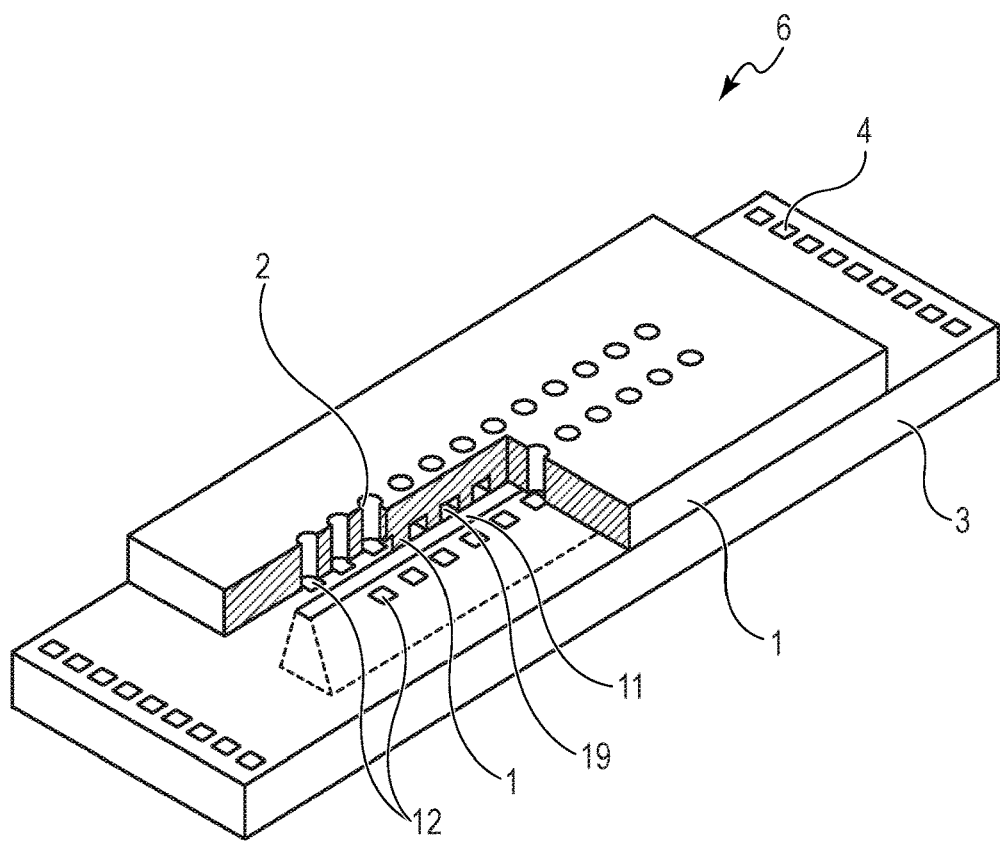
FIGS. 1A and 1B show the constitutions of a liquid ejection head.

Preferred embodiments of the present invention will now be described in detail in accordance with the accompanying drawings.

In the method disclosed in Japanese Patent Application Laid-Open No. H10-303101 or H11-340113, a substrate or base film cannot be brought into contact with an anti-adhesion plate or guard ring and there inevitably appears a space between them. The influence of rinse splashes on a resist film therefore still remains.

An object of the invention is to prevent deterioration in the quality of a resist film due to rinse splashes during side rinsing.

Embodiments of the invention will hereinafter be described referring to some drawings. The embodiments described below are not intended to limit the invention and all the combinations of the characteristics described in the embodiments are not always essential for the solution of the invention. When constitutions are the same, they will be described using the same reference numerals. The relative arrangement, shape and the like of the constituents described in the embodiments are just examples and the scope of the invention is not intended to limit to them. The numerical values shown in the following embodiments are exemplary only and the invention is not limited to or by them. In addition, the invention is not limited to these embodiments and includes combination of them or application to another technical field.

<Object to which Resist Material is Applied>

An object to which a resist material is applied may be either a silicon substrate or a base film. The embodiments which will hereinafter be described include a substrate processing method for forming a resist film on a substrate and a dry film manufacturing method including forming a resist film on a base film. The term "dry film" means a film obtained by forming a thin film of a resist material on a base film and then carrying out heat treatment called "baking".

In general, when a thin film of a resist material is stacked on a substrate, the resist material is directly applied onto the substrate by spin coating. Then, an exposure step, a development step and the like are performed to form a desired pattern on the substrate. On the other hand, when, a resist material cannot be applied directly onto the substrate, a dry film is formed in advance by applying a resist material onto a base film by spin coating. The dry film thus formed is then transferred to the substrate by vacuum lamination. The substrate to which the dry film has been transferred is then subjected to an exposure step, a development step and the like to form a desired pattern on the substrate.

Examples of a substrate onto which a resist material cannot directly be applied include a substrate to be mounted on a liquid ejection head used in a liquid ejection apparatus such as ink jet recording apparatus. Such a substrate has therein an ink supply through-port and is not flat. When a thin film of a resist material is stacked on the substrate, a resist material cannot therefore be applied directly thereto. A resist film is therefore formed on the substrate by transferring a dry film to the substrate.

When the dry film has a resist film on the entire surface thereof, transferring of it using a transfer apparatus may cause contamination in the apparatus. Also for the manufacture of a dry film, side rinsing is performed to remove an unnecessary portion of a resist film.

When a dry film is formed, the dry film thus formed has a resist film on a base film larger than a substrate. The resulting dry film is transferred to the substrate. The film is then cut into the shape of the substrate and an unnecessary portion of the film is peeled off. As described above, since the base film is larger than the substrate, the resist is removed from a wider region by side rinsing on the base film than by side rinsing of a wafer edge portion of the substrate. In the case of a resist material used for an ejection orifice of ink jet, the film thickness of a resist material formed on a dry film formed by spin coating is as thick as from about 5 to 75 µm. Formation of a base film by spin coating requires high-pressure and long-hours jetting of a large amount of a solvent for side rinsing so that a larger amount of rinse splashes occurs. There is therefore a further demand for reducing deterioration in the quality of a resist film due to rinse splashes when a dry film is formed. In the below-described embodiments, a description will be made while focusing on a dry film manufacturing method (formation method). The embodiments described below can be useful also for a step of subjecting a substrate to side rinsing.

First Embodiment

Figure 1B:
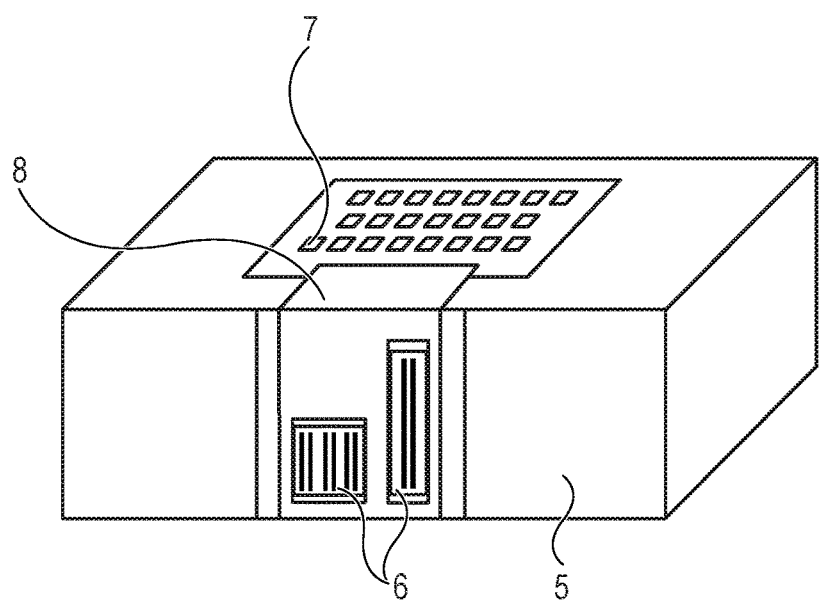

FIGS. 1A and 1B show an example of a liquid ejection head 5 and a recording element substrate 6 each to be used in a liquid ejection apparatus. A dry film which will be described in the present embodiment is used as a material for manufacturing the liquid ejection head 5 (recording element substrate 6).

FIG. 1A is a perspective view of a typical recording element substrate 6. The recording element substrate 6 is comprised of a substrate 3 for liquid ejection head equipped with energy generating elements 12 and an ejection orifice formation member 1 formed on the liquid ejection head substrate 3. The liquid ejection head substrate 3 is provided with the energy generating elements 12. The ejection orifice formation member 1 has a plurality of through-holes penetrating through a portion of the member facing with the surface of the liquid ejection head substrate 3 provided with the energy generating elements 12. Such an ejection orifice formation member 1 is made of a resin material and the plurality of through-holes is formed simultaneously by photolithography and etching.

The through-holes provided in the ejection orifice formation member 1 penetrate through a first opening portion which is opened at a position facing with the surface of the liquid ejection head substrate 3 equipped with the energy generating elements 12 and a second opening portion provided on a liquid ejection side. The plurality of through-holes is used as an ejection orifice 2 for ejecting a liquid by making use of energy generated by the energy generating element 12. They are arranged in a row at a predetermined pitch and constitute an ejection orifice row.

As the energy generating elements 12 of the liquid ejection head substrate 3, an electrothermal conversion element (heater), a piezoelectric element (piezo element) or the like can be used. A plurality of energy generating elements 12 is provided at a position facing with the ejection orifice row and they constitute an element row. At a position between the element rows, an ink supply port 11 which penetrates through the liquid ejection head substrate 3 and supplies the energy generating elements 12 with a liquid is provided. There is a mode in which one liquid ejection head substrate 3 has therein one ink supply port 11 or a mode in which one liquid ejection head substrate 3 has a plurality of ink supply ports.

Further, by bringing the ejection orifice formation member 1 into contact with the liquid ejection head substrate 3, the space therebetween serves as an ink flow path 19. The recording element substrate 6 has connection terminals 4 for supplying the energy generating elements 12 with electricity.

FIG. 1B schematically shows the constitution of the liquid ejection head 5. The recording element substrate 6 is attached to the liquid ejection head 5 and liquid ejection operation is performed by supplying electricity to the recording element substrate 6 from a contact pad 7 via a flexible wiring substrate 8.

Next, a dry film manufacturing method will specifically be described referring to FIGS. 2 to 5H. FIG. 2 and FIGS. 3A to 3F show, for comparison, an example of a conventional manufacturing method. FIG. 4 and FIGS. 5A to 5H are views for describing a dry film manufacturing method of the present embodiment. The dry film manufacturing method of the present embodiment includes, in addition to the conventional method, a step of forming a layer of a protecting material (protecting film) on the resist film. Details will be described later.

<Manufacturing Method to be Compared>

Prior to describing the dry film manufacturing method of the present embodiment, a dry film manufacturing method (film formation method) to be compared will be described.

Figure 2:
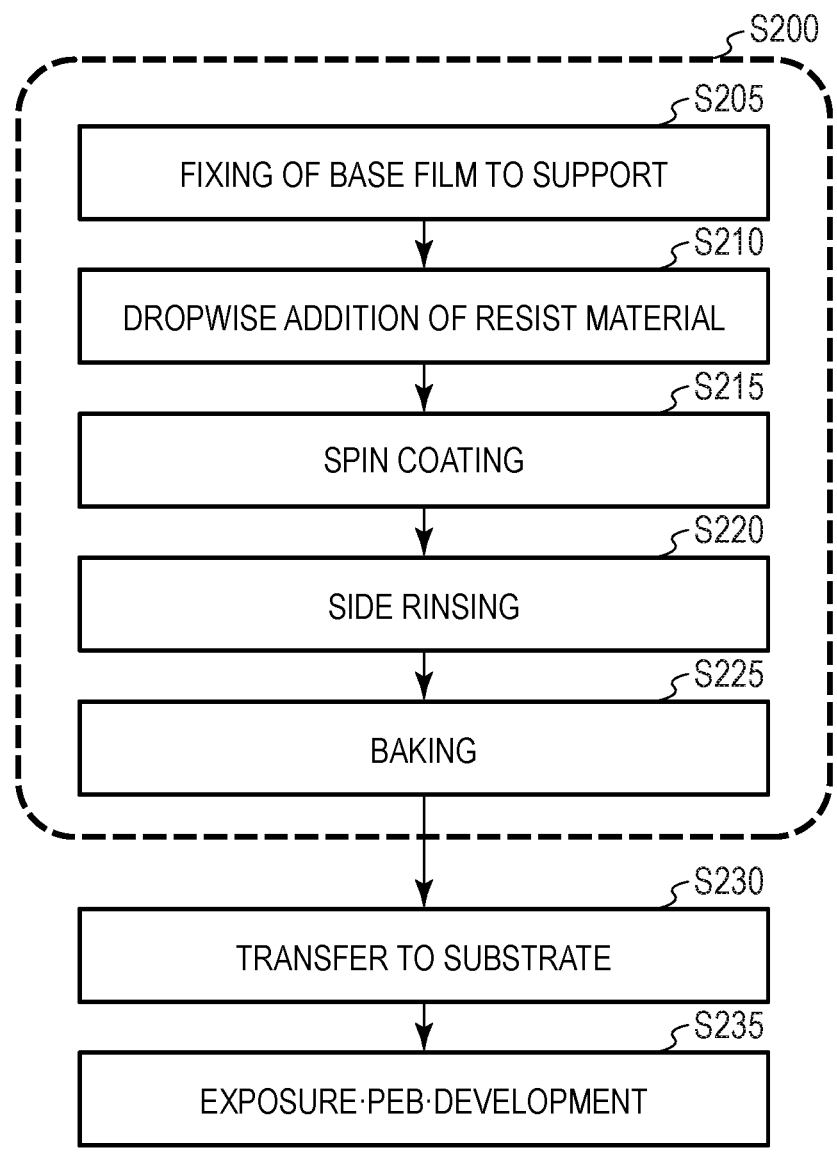
FIG. 2 is a flow chart including a dry film manufacturing method.

FIG. 2 shows steps of manufacturing a dry film by spin coating. FIGS. 3A to 3F schematically show how the dry film is manufactured. FIGS. 3A to 3F each include a top view and a cross-sectional view. The manufacturing steps are performed successively in the order from FIG. 3A to FIG. 3F. The dry film manufacturing method to be compared will hereinafter be described referring to FIG. 2 and FIGS. 3A to 3F. Then, the dry film manufacturing method of the present embodiment will be described.

Step S200 of FIG. 2 is a dry film manufacturing step (formation step) for forming a layer of a resist material (resist film) by spin coating. Step S200 can be divided into Steps S205 to S225.

Figure 3A:
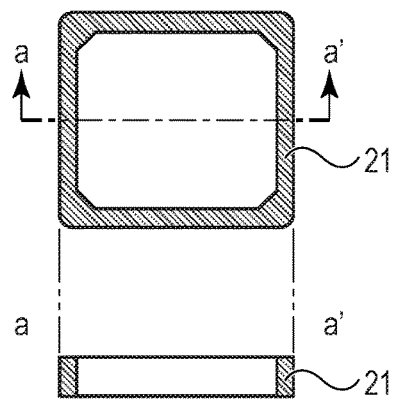
FIGS. 3A, 3B, 3C, 3D, 3E and 3F describe the dry films manufacturing method.
Figure 3B:
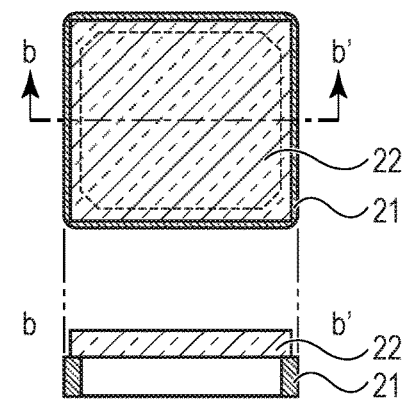

In Step S205, a base film is fixed to a support 21 as shown in FIGS. 3A and 3B. The base film 22 is fixed without causing twists or wrinkles in consideration of the application accuracy of a resist material or influence at the time of transferring the base film to a substrate later. The base film 22 is fixed to the support 21 by bonding them with a double-sided tape or adhesive (not shown). The support 21 having the base film fixed thereto is fixed to a rotary chuck not shown.

Figure 3C:
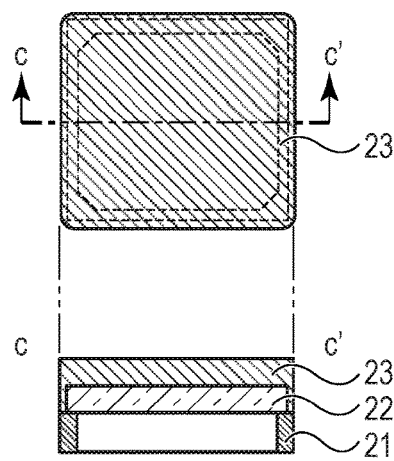

In Step S210, as shown in FIG. 3C, a resist material 23 is added dropwise onto the surface of the base film 22 (an object to be applied) fixed to the support 21. In Step S215, the resist material 23 is applied to the surface of the base film 22 by spin coating to form a resist film. More specifically, the resist material 23 being added dropwise to the surface of the base film 22 spreads by centrifugal force caused by high-speed rotation of the support 21 and thus, the resist film is formed. The resist material 23 is a material sparingly soluble in a solvent, for example, water (first dissolving liquid), used for removal of a protecting material 24 shown later. The resist material 23 is, for example, an organic material and specific examples of the resist material 23 include photosensitive resins (such as epoxy resin).

Figure 3D:
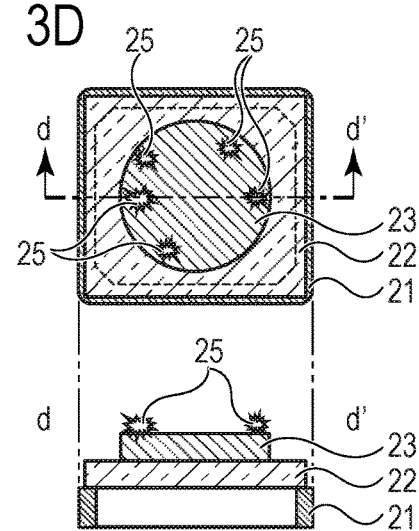
Figure 3E:
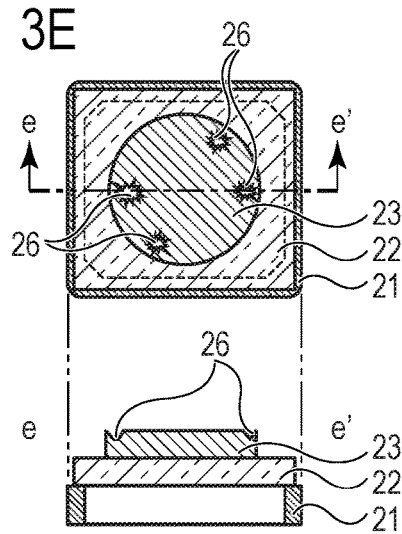

In Step S220, as shown in FIG. 3D, side rinsing is performed using an applicator or the like having a side rinsing mechanism (not shown). In this step, a portion of the resist material 23 at a desired position is removed by side rinsing by applying a solvent capable of dissolving the resist material therein (second dissolving liquid) to the outside of an effective region while rotating the support 21. At this time, as shown in FIG. 3D, a portion of a side rinse liquid used for side rinsing scatters as rinse splashes 25 and adheres to the surface of the resist material 23. Even if application of the resist material is completed and a film can be formed with high precision, a portion of the resist material 23 is dissolved by the rinse splashes 25 which have adhered to the surface of the resist material and a dissolution portion 26 is inevitably formed in the resist film as shown in FIG. 3E. The second dissolving liquid is a liquid capable of dissolving the resist material 23 therein more easily than the first dissolving liquid.

Figure 3F:
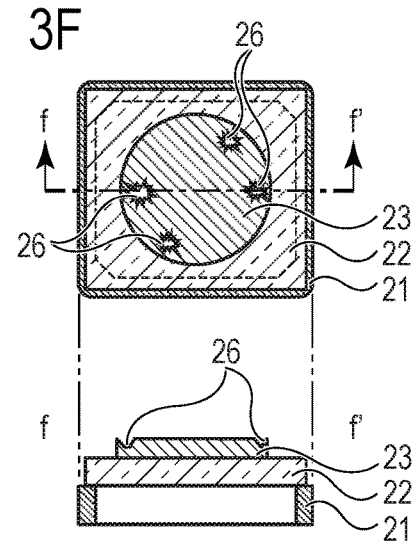

In Step S225, baking is performed and by this step, dry film formation is completed as shown in FIG. 3F. Baking is a step of heating the resist-applied film to remove the solvent from the resist and disperse the molecules of the resist uniformly and thereby stabilize them.

Then, the dry film thus manufactured is transferred to a substrate in Step S230. In Step S235, by making use of the resist film of the dry film thus transferred, a pattern is formed on the substrate after steps such as pattern exposure, PEB (post exposure bake) and development. As described above, the dry film thus manufactured is transferred to the substrate as is so that as a result, the dissolution portion 26 becomes a portion of a liquid ejection head. At the dissolution portion 26, the film quality deteriorates and a desired pattern is not formed, which may inevitably cause deterioration in quality.

<Manufacturing Method of Present Embodiment>

Figure 4:
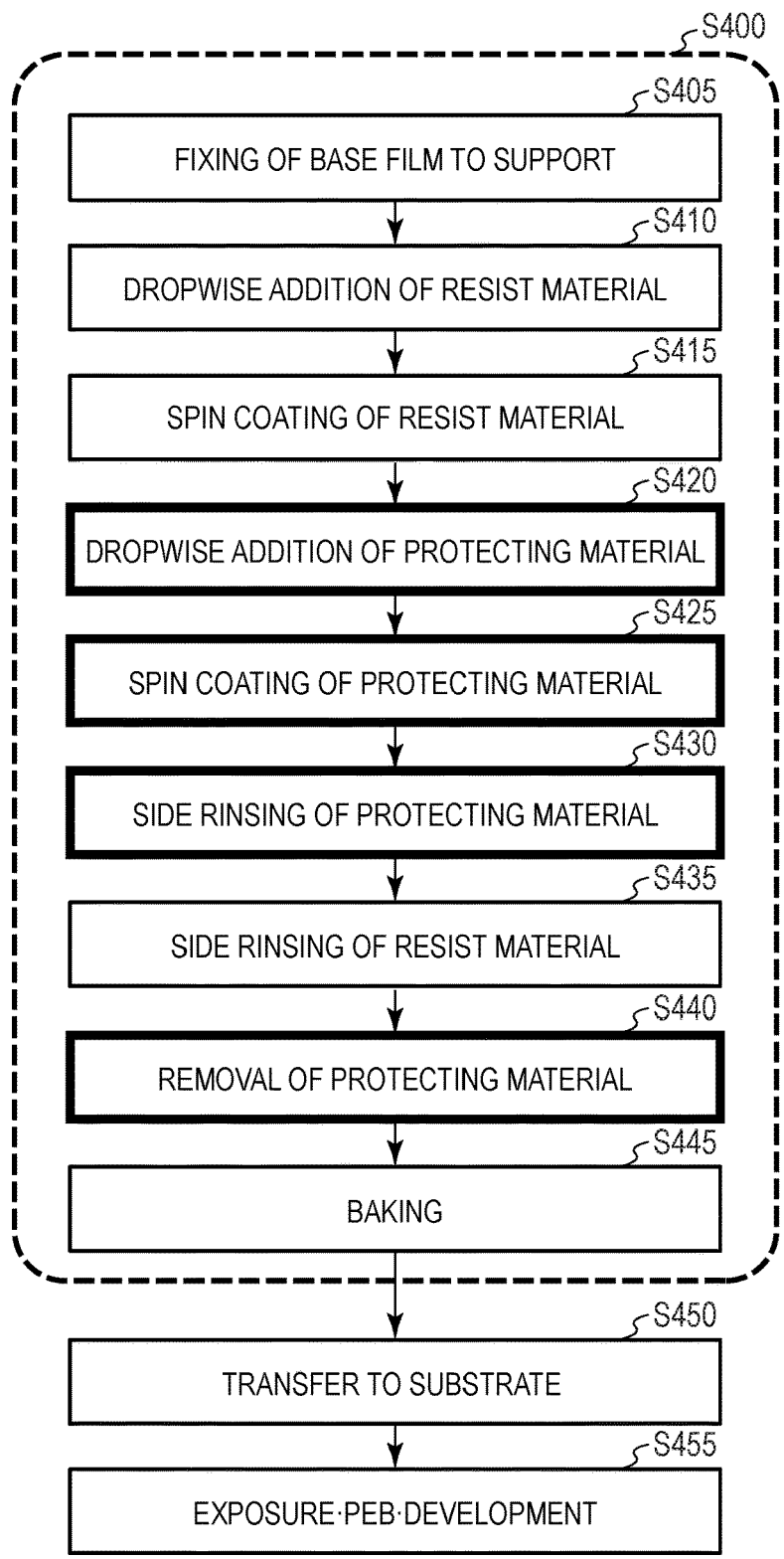
FIG. 4 is a flow chart including a dry film manufacturing method according to Embodiment.

Next, as shown in FIG. 4 and FIGS. 5A to 5H, the dry film manufacturing method (film formation method) of the present embodiment will be described. FIG. 4 shows dry film manufacturing steps of the present embodiment using spin coating. FIGS. 5A to 5H schematically show how a dry film is formed by the manufacturing method of the present embodiment. FIGS. 5A to 5H each include a top view and a cross-sectional view. The manufacturing steps are performed successively in the order from FIGS. 5A to 5H. The dry film manufacturing method of the present embodiment will hereinafter be described referring to FIG. 4 and FIGS. 5A to 5H. The present embodiment includes, in addition, respective steps of forming and removing a film of a protecting material 24 during formation of a film of a resist material 23 on a base film 22.

Step S400 of FIG. 4 is a dry film manufacturing step (forming step) in which a resist film is formed by spin coating. Step S400 can be divided into Steps S405 to S445. The steps shown in FIG. 4 are only exemplary and may include another step.

Figure 5A:
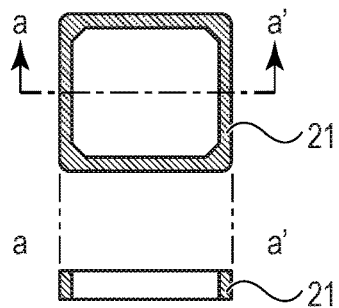
FIGS. 5A, 5B, 5C, 5D, 5E, 5F, 5G and 5H describe the dry films manufacturing method according to Embodiment.
Figure 5B:
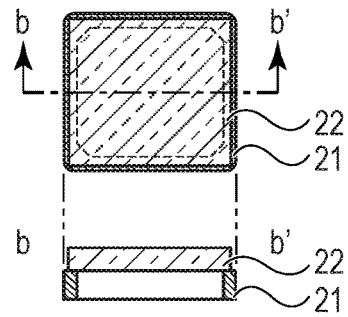
Figure 5C:
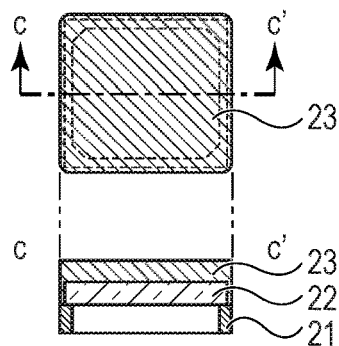

Steps S405 to S415 are similar to Steps S205 to S215 shown in FIG. 2. FIGS. 5A to 5C are similar to those shown in FIGS. 3A to 3C and they include from fixing of a base film 22 (film layer) to a support 21 to application of a resist material 23 to be used as a material of a liquid ejection head by spin coating.

Figure 5D:
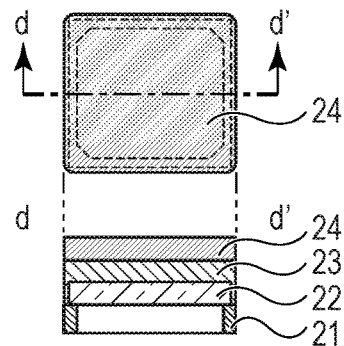

Next, in Step S420, a protecting material is added dropwise to the upper surface of a resist layer made of the resist material 23. Then, in Step S425, a layer of a protecting material 24 is formed further on the resist material 23 by spin coating as shown in FIG. 5D. The protecting material 24 is made of a material permitting film formation or removal of the film while affecting the resist material 23 as little as possible. One example of it is a water-soluble material. When a film material under such a state is stored, the film of the protecting material 24 is effective for preventing a foreign matter floating in the vicinity of the film or the like from attaching thereto due to static charge or preventing the solvent of the resist material 23 from evaporating. Thus, it can suppress deterioration in quality of a dry film during storage such as deterioration in exposure sensitivity due to contamination or drying of the film. A film material having a layer of the protecting material 24 on the resist material 23 may therefore be stored.

Figure 5E:
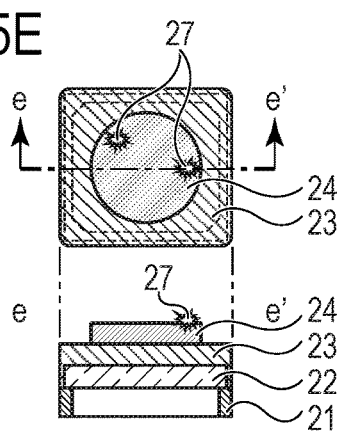

Next, in Step S430, a portion of the layer of the protecting material 24 outside the effective region is side rinsed to remove the protecting material 24 as shown in FIG. 5E. At this time, side rinsing is performed using a side rinse liquid (first dissolving liquid) which can remove only the protecting material 24 and does not affect the resist material 23. In short, the first dissolving liquid preferably does not dissolve the resist material 23 therein. As described above, when the protecting material 24 is water soluble, a water-based material is used as the side rinse liquid. As shown in FIG. 5E, rinse splashes 27 occur also during side rinsing of the protecting material 24. The rinse splashes 27 of the side rinse liquid for the protecting material adhere only to the surface of the protecting material 24 and are hard to dissolve the resist material 23. Adhesion of the rinse splashes 27 to the surface of the protecting material 24 may dissolve a portion of the surface of the layer of the protecting material 24. As shown in FIG. 5E, however, the layer of the protecting material 24 itself is still kept on the effective region of the resist material 23.

Figure 5F:
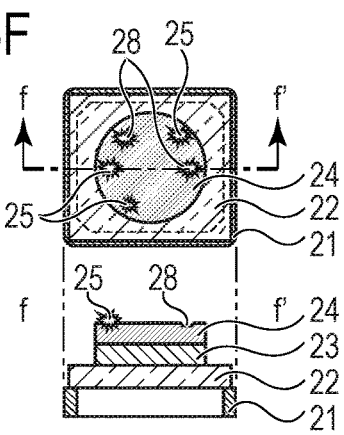

Next, in Step S435, the resist material 23 is side rinsed. Step S435 is similar to Step S220. In Step S435, the resist material 23 outside the effective region is removed as shown in FIG. 5F. Removal of the resist material 23 is performed using a solvent or the like (second dissolving liquid) capable of selectively removing the resist material 23 without affecting the protecting material 24. As shown in FIG. 5F, the protecting material 24 partially has the dissolution portion 28, but the layer of the protecting material 24 covers the effective region of the resist material 23. Although rinse splashes 25 of the solvent occur partially by side rinsing, the protecting material 24 is present on the upper surface of the resist material 23 in the effective region as shown in FIG. 5F and therefore, the rinse splashes 25 of the solvent adhere to the upper surface of the protecting material 24 without direct contact with the resist material 23. Deterioration in film quality such as dissolution hardly occurs within the effective region of the resist material 23.

Figure 5G:
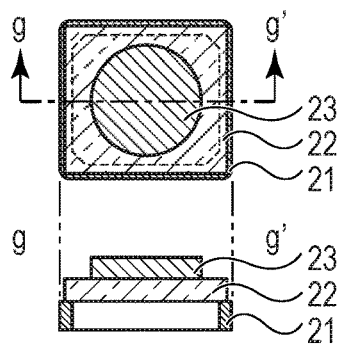

Then, in Step S440, the protecting material 24 remaining on the upper surface of the resist material 23 is removed as shown in FIG. 5G. In Step S440, similar to side rinsing of the protecting material 24 in Step S430, the protecting material 24 is removed with a side rinse liquid (first dissolving liquid) not affecting the resist material 23. As described above, when the protecting material 24 is a water-soluble material, a water-based material is used as the side rinse liquid. Using water as the side rinse liquid and pouring a large amount of water to the film surface is effective for the removal of the protecting material 24 and also for removal of static electricity with which the base film 22 has been charged.

Figure 5H:
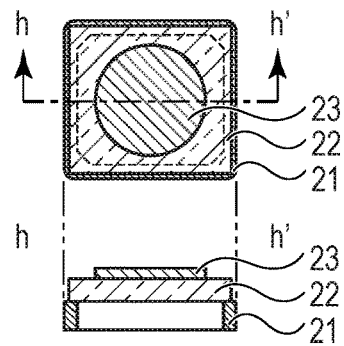

By the above-described manufacturing steps, a film of the resist material 23 (resist film) having intended high quality can be formed. In the final Step S445, baking is performed to obtain a high quality dry film using spin coating as shown in FIG. 5H. In the dry film of FIG. 5H compared with the dry film of FIG. 3F, the resist material 23 has an edge kept flat.

In Step S430, a region of the protecting material 24 to be side rinsed is preferably substantially similar to a region of the resist material to be side rinsed. When the side-rinsed region of the protecting material 24 is larger than the side-rinsed region of the resist material, there appears a region not covered with a layer of the protecting material 24. Then, rinse splashes 25 inevitably adhere to some region of the resist material 23. When the side-rinsed region of the protecting material 24 is smaller than the side-rinsed region of the resist material, on the other hand, the layer of the protecting material 24 remains also outside the effective region. This leads to insufficient side rinsing of the region of the layer of the resist material 23 other than the effective region. It is therefore preferred that the side-rinsed region of the protecting material 24 is also outside the effective region.

In the description referring to the flow chart of FIG. 4, the layer of the protecting material 24 is formed, followed by side rinsing of the protecting material 24. Alternatively, side rinsing may be performed while forming the layer of the protecting material 24. In other words, Steps S420 to S430 may be performed simultaneously or dropwise addition of the protecting material 24 and addition of the side rinse liquid are performed simultaneously while rotating the support 21.

In manufacturing a liquid ejection head, the dry film manufactured by the method shown in Step S400 is provided. In addition, a substrate having ink supply through-holes therein is provided. Next, in Step S450, the dry film is transferred onto this substrate having ink supply through-holes therein. Then, in Step S455, an intended pattern using the dry film material can be obtained by carrying out exposure, PEB, development and the like. By repeating these steps and stacking the patterns, a highly precise liquid ejection head can be manufactured.

As described above, according to the present embodiment, even when side rinsing for removal of the resist material is performed by applying a large amount of a solvent for long hours under high pressure, deterioration in the quality of the resist film due to rinse splashes during side rinsing can be prevented. A dry film having a highly precise resist film on a base film can therefore be obtained. A highly precise liquid ejection head can be provided by using this dry film.

In addition, a layer of the protecting material 24 provided on the base film 22 as in the present embodiment can suppress the resist film from drying and permits long-term storage of the base film 22. In addition, during formation of the protecting film, contact or adhesion of dusts to the resist film can be suppressed. Further, static charge generated during storage can be removed by a water stream used for removing the layer of the protecting material 24 so that charging of the dry film can also be prevented.

Second Embodiment

In First Embodiment, described was a mode of applying a resist material and a protecting material by spin coating. In the present embodiment, a resist material and a protecting material are applied by the slit nozzle method. Different from spin coating in which a resist material added dropwise is rotated at high speed and a film is formed on the surface by centrifugal force, the slit nozzle method is a mode of applying a resist material ejected from a slit nozzle. If there is any restriction and spin coating cannot be used on the base film, a resist material is applied thereto by the slit nozzle method. As described in First Embodiment, in order to avoid contamination in a transfer apparatus, not a dry film obtained by applying a resist material on the entire surface of the base film but a dry film obtained by partially removing the resist material is sometimes required. Even when a resist material is applied by the slit nozzle method, therefore, side rinsing is preferably performed as described in First Embodiment.

Also in the slit nozzle method, as in First Embodiment, the base film is fixed to the support 21 as shown in FIGS. 5A and 5B and then, fixed onto a rotary chuck. A resist material from a slit nozzle is applied without rotating the chuck and then, the protecting material is applied. Then, the rotary chuck is rotated and as described in First Embodiment, the protecting material is side rinsed, followed by side rinsing of the resist material.

Thus, the dry film manufacturing method can also be used for application of a resist material and a protecting material by the slit nozzle method.

Modification Example 1

In the above modes, a dry film manufacturing method was described. Side rinsing of the dry film is sometimes performed under higher pressure for longer hours than side rinsing of a substrate because the area and thickness of the dry film removed by side rinsing are larger than those of the substrate. Such side rinsing is likely to cause rinse splashes. The resist film obtained in the above-described embodiments has a high protecting effect. The invention is however not limited to a dry film manufacturing method. For example, it may be used for a mode of directly applying a resist material onto a silicon substrate (wafer substrate). Even in this case, deterioration in film quality of the resist material due to rinse splashes generated during side rinsing can be suppressed.

Modification Example 2

For application of a resist material and a protecting material, not only the above-described spin coating or slit nozzle method but also, for example, various coating methods such as slit die method and gravure roll method can be used.

Modification Example 3

In the above modes, described was an example of applying a protecting material to the entire upper surface of a resist material and then side rinsing the protecting material outside the effective region. As described above, the layer of the protecting material is removed after side rinsing of the resist material. The layer of the protecting material is thus removed in the end so that different from the resist film, it does not necessarily have a uniform film thickness. The application method of the protecting material may be any method and it is not required to form a film with uniform thickness. The side rinsing step of the protecting material can be omitted if the layer of the protecting material can be formed only on the effective region.

Example

Example will hereinafter be described. In the present example, used as the support 21 was a square frame made of SUS420J2 stainless steel and having an outside dimension of 320 mm×290 mm, inside dimension of 270 mm×239 mm, and thickness of 1.2 mm. As the base film 22, used was a film with a release film obtained by subjecting a roll-shaped PET thin film having a thickness of 100 μm and a width of 254 mm to release treatment and cut into a length of the support 21. The base film 22 was fixed using a film fixing apparatus ("FTM-320", trade name; product of Takatori Corporation). Application of the resist material 23 onto the base film 22, application of the protecting material 24, side rinsing and removal of the protecting material 24 were all performed using a frame-conformable coater ("SUS frame-conformable coater", trade name; product of Tokyo Ohka Kogyo). Application of the resist material 23 onto the base film 22, application of the protecting material 24, side rinsing and removal of the protecting material 24 were all performed at rotation speed of from 500 to 1000 rpm. As the resist material 23, a photosensitive epoxy resin was used. As the protecting material 24, PVA (polyvinyl alcohol) was used. As the side rinse liquid of the protecting material 24, water was used. As the side rinse liquid of the resist material 23, PGMEA (propylene glycol methyl ether acetate) was used and the liquid was applied to the resist material 23 at a flow rate of about 0.5 L/min for about 60 to 120 seconds. Baking after application was performed at 90° C. for 20 minutes by using a frame-conformable coater ("SUS frame-conformable coater", trade name, product of Tokyo Ohka Kogyo). The intended dry film using spin coating was thus obtained. The resist material 23 thus formed had a thickness of about 15 μm.

The dry film thus formed was transferred to the substrate by a vacuum bonding apparatus ("VTM-200F", trade name; product of Takatori Corporation). The resist film transferred to the substrate was exposed to light by using an i-line stepper ("iV", trade name; product of Canon). After PEB (post exposure bake) on a hot plate and development, a desired high-precision pattern was obtained.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-153131, filed Aug. 8, 2017, which is hereby incorporated by reference herein in its entirety.

What is claimed is:

1. A method of forming a film, comprising:
   a step of forming a resist film on an object to be applied,
   a step of forming a layer of a protecting material removable by a first dissolving liquid on an upper surface of the resist film,
   a step of removing the resist film from a region of the resist film not having, on the upper surface thereof, the layer of the protecting material by side rinsing with a second dissolving liquid capable of dissolving the resist film therein, and
   a step of removing the protecting material remaining on the upper surface of the resist film by the first dissolving liquid.

2. The method of forming a film according to claim 1,
   wherein the step of forming a layer of a protecting material comprises a step of removing the protecting material formed outside an effective region by side rinsing with the first dissolving liquid.

3. The method of forming a film according to claim 1,
   wherein the step of removing the resist film is performed while covering the resist film in an effective region with the protecting material.

4. The method of forming a film according to claim 1,
   wherein the resist film has an organic material and the protecting material has a water soluble material.

5. The method of forming a film according to claim 4,
   wherein the first dissolving liquid is a water-based material.

6. The method of forming a film according to claim 1,
   wherein the layer of the protecting material and the resist film are formed by spin coating.

7. The method of forming a film according to claim 1,
   wherein the layer of the protecting material and the resist film are formed by slit nozzle method.

8. A method of manufacturing a dry film, comprising:
   a step of forming a resist film on a base film,
   a step of forming a layer of a protecting material removable by a first dissolving liquid on an upper surface of the resist film,
   a step of removing the resist film from a region not having, on an upper surface thereof, the layer of the protecting material by side rinsing with a second dissolving liquid capable of dissolving the resist film therein, and
   a step of removing the protecting material remaining on the upper surface of the resist film by the first dissolving liquid.

9. The method of manufacturing a dry film according to claim 8,
   wherein the step of forming the layer of the protecting material comprises:
   a step of removing the protecting material formed outside an effective region by side rinsing with the first dissolving liquid.

10. The method of manufacturing a dry film according to claim 8,
    wherein the step of removing the resist film is performed while covering the resist film in an effective region with the protecting material.

11. The method of manufacturing a dry film according to claim 8,
    wherein the resist film has an organic material and the protecting material has a water soluble material.

12. The method of manufacturing a dry film according to claim 11,
    wherein the first dissolving liquid is a water-based material.

13. The method of manufacturing a dry film according to claim 8,
    wherein the layer of the protecting material and the resist film are formed by spin coating.

14. The method of manufacturing a dry film according to claim 8,
    wherein the layer of the protecting material and the resist film are formed by slit nozzle method.

15. A method of manufacturing a liquid ejection head, comprising:
    a step of providing a substrate having a supply port therein,
    a step of forming a resist film on a base film, a step of forming a layer of a protecting material removable by a first dissolving liquid on an upper surface of the resist film, a step of removing the resist film from a region of the resist film not having, on the upper surface thereof, the layer of the protecting material by side rinsing with a second dissolving liquid capable of dissolving the resist film therein, a step of removing the protecting material remaining on the upper surface of the resist film by the first dissolving liquid, a step of transferring the resist film formed on the base film to the substrate, and a step of forming a pattern on the substrate having the resist film transferred thereto.

16. The method of manufacturing a liquid ejection head according to claim 15, wherein the step of removing the resist film is performed while covering the resist film in the effective region with the protecting material.

17. The method of manufacturing a liquid ejection head according to claim 15, wherein the resist film has an organic material and the protecting material has a water soluble material.

18. The method of manufacturing a liquid ejection head according to claim 17, wherein the first dissolving liquid is a water-based material.

19. The method of manufacturing a liquid ejection head according to claim 15, wherein the layer of the protecting material and the resist film are formed by spin coating.

20. The method of manufacturing a liquid ejection head according to claim 15, wherein the layer of the protecting material and the resist film are formed by slit nozzle method.

* * * * *